United States Patent
Lee et al.

(10) Patent No.: US 9,026,870 B2
(45) Date of Patent: May 5, 2015

(54) MEMORY MODULE AND A MEMORY TEST SYSTEM FOR TESTING THE SAME

(71) Applicant: Samsung Electronics Co., Ltd., Gyeonggi-do (KR)

(72) Inventors: Jung-kuk Lee, Gyeonggi-do (KR); Sang-seok Kang, Gyeonggi-do (KR); Woo-seop Kim, Seoul (KR); Hyun-soo Kim, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 141 days.

(21) Appl. No.: 13/800,605

(22) Filed: Mar. 13, 2013

(65) Prior Publication Data
US 2014/0032984 A1    Jan. 30, 2014

Related U.S. Application Data

(60) Provisional application No. 61/676,601, filed on Jul. 27, 2012.

(30) Foreign Application Priority Data

Jan. 31, 2013    (KR) .................... 10-2013-0011488

(51) Int. Cl.
| | | |
|---|---|---|
| *G11C 29/00* | (2006.01) | |
| *G11C 29/08* | (2006.01) | |
| *G11C 29/56* | (2006.01) | |
| *G11C 29/14* | (2006.01) | |
| *G11C 7/22* | (2006.01) | |
| *G11C 11/4096* | (2006.01) | |

(Continued)

(52) U.S. Cl.
CPC ................ *G11C 29/08* (2013.01); *G11C 29/14* (2013.01); *G11C 7/22* (2013.01); *G11C 11/4096* (2013.01); *G11C 5/04* (2013.01); *G11C 11/40* (2013.01); *G11C 29/56* (2013.01); *G11C 2029/0401* (2013.01); *G11C 2029/0407* (2013.01)

(58) Field of Classification Search
CPC ...... G11C 29/14; G11C 11/4096; G11C 7/22; G11C 2029/0407; G11C 29/08; G11C 11/40; G11C 2029/0401; G11C 5/04; G11C 29/56
USPC .................................... 714/718, 25; 365/201
See application file for complete search history.

(56) References Cited

U.S. PATENT DOCUMENTS

| | | |
|---|---|---|
| 6,851,076 B1 | 2/2005 | Cook, III et al. |
| 7,349,272 B2 | 3/2008 | Do et al. |

(Continued)

FOREIGN PATENT DOCUMENTS

| | | |
|---|---|---|
| KR | 1020030057618 | 7/2003 |
| KR | 1020070075083 | 7/2007 |

(Continued)

*Primary Examiner* — John P Trimmings
(74) *Attorney, Agent, or Firm* — F. Chau & Associates, LLC (57) ABSTRACT

A memory module includes a first rank, a second rank and a test control unit. The first rank includes a plurality of semiconductor memory devices configured to operate in response to a first chip selection signal. The second rank includes a plurality of semiconductor memory devices configured to operate in response to a second chip selection signal. The test control unit is configured to simultaneously enable the first and second chip selection signals to test the first and second ranks in a test mode.

19 Claims, 8 Drawing Sheets

(51) Int. Cl.
    *G11C 5/04*         (2006.01)
    *G11C 11/40*      (2006.01)
    *G11C 29/04*      (2006.01)

(56) References Cited

U.S. PATENT DOCUMENTS

| | | |
|---|---|---|
| 7,607,055 B2 | 10/2009 | Jung et al. |
| 7,814,379 B2 | 10/2010 | Lee et al. |
| 7,971,117 B2 | 6/2011 | Lee et al. |
| 8,108,741 B2 | 1/2012 | Kim et al. |
| 8,125,236 B2 | 2/2012 | Lee et al. |
| 8,300,496 B2 | 10/2012 | Yun et al. |
| 8,441,876 B2 * | 5/2013 | Song ............................. 365/201 |
| 2001/0013110 A1 * | 8/2001 | Pierce et al. .................. 714/718 |
| 2008/0091979 A1 | 4/2008 | Okuda |
| 2008/0104290 A1 * | 5/2008 | Cowell et al. ................... 710/71 |
| 2011/0176371 A1 * | 7/2011 | Jang et al. ................ 365/189.05 |
| 2011/0310685 A1 | 12/2011 | Song |
| 2012/0117430 A1 | 5/2012 | Yang et al. |

FOREIGN PATENT DOCUMENTS

| | | | | |
|---|---|---|---|---|
| KR | 1020 080036833 | * | 4/2008 | ............. G06F 11/22 |
| KR | 1020080035833 | | 4/2008 | |
| KR | 1020120021782 | | 3/2012 | |
| KR | 1020120025047 | | 3/2012 | |

\* cited by examiner

MEMORY MODULE AND A MEMORY TEST SYSTEM FOR TESTING THE SAME

CROSS-REFERENCE TO RELATED APPLICATIONS

This application claims priority to U.S. Provisional Patent Application No. 61/676,601, filed on Jul. 27, 2012, in the U.S. Patent and Trademark Office, and Korean Patent Application No. 10-2013-0011488, filed on Jan. 31, 2013, in the Korean Intellectual Property Office, the disclosures of which are incorporated by reference herein in their entireties.

BACKGROUND

1. Technical Field

The inventive concept relates to a memory module and a memory test system for testing the same, and more particularly, to a memory module including a plurality of ranks and a memory test system for testing the same.

2. Discussion of the Related Art

A memory module generally includes one or more semiconductor memory devices mounted on a printed circuit board for use in a memory system. For example, the memory module can be installed on a main board found in computers or other expandable systems. In particular, if the semiconductor memory devices of the memory module are dynamic random access memories (DRAMs), the memory module may operate as a data memory in a computing system such as a personal computer (PC), a workstation, a server, or the like. In general, manufacturers of memory modules test the memory modules at a system level. In other words, the memory module is tested in an operational environment thereof.

To test the memory module at the system level, the memory module is installed on a memory test system, and then, the memory module is removed from the memory test system after testing is complete, for example. As the semiconductor memory devices of the memory module have higher capacities and higher speeds, a time for testing the memory module may increase. Accordingly, system level testing of the memory module can negatively affect its productivity.

SUMMARY

An exemplary embodiment of the inventive concept provides a memory module and a memory test system for testing the same whereby a time for testing the memory module at a system level is reduced.

According to an exemplary embodiment of the inventive concept, there is provided a memory module including: a first rank which includes a plurality of semiconductor memory devices configured to operate in response to a first chip selection signal; a second rank which includes a plurality of semiconductor memory devices configured to operate in response to a second chip selection signal; and a test control unit configured to simultaneously enable the first and second chip selection signals to test the first and second ranks in a test mode.

The test control unit may include a memory buffer or a register clock driver, and the memory module may be a registered dual in-line memory module (RDIMM).

The test control unit may be configured to receive a command signal through a plurality of lines from an external source and may be put in the test mode or released from the test mode in response to the command signal.

The test control unit may include a test mode terminal and may be put in the test mode in response to a signal received through the test mode terminal.

The test control unit may be configured to receive first and second rank selection signals corresponding to the first and second ranks from an external source.

If the test control unit is in the test mode, the test control unit may be configured to output the first rank selection signal as the first and second chip selection signals.

If the test control unit is in the test mode, the test control unit may be configured to simultaneously enable the first and second chip selection signals when the first and second rank selection signals are simultaneously enabled.

The semiconductor memory devices may include dynamic random access memories.

According to an exemplary embodiment of the inventive concept, there is provided a memory test system including: at least one socket configured to connect with a memory module including first and second ranks; a memory controller configured to output first and second rank selection signals respectively corresponding to the first and second ranks and control the memory module; and a processing unit configured to determine whether to place the memory module in a test mode and, if the memory module is placed in the test mode, the processing unit is configured to recognize the first and second ranks as a rank.

The processing unit may be configured to perform a basic input/output system (BIOS) and determine whether to place the memory module in the test mode by performing the BIOS.

The processing unit may include a general-purpose terminal and may be configured to determine whether to place the memory module in the test mode in response to a signal received through the general-purpose terminal.

The memory test system may further include: an input/output (IO) device controller configured to control an input device through which a user inputs a command. The processing unit may be configured to determine whether to place the memory module in the test mode in response to a signal received through the IO device controller.

If the memory module is in the test mode, the memory controller may be configured to output the first and second rank selection signals at the same time.

The memory controller and the processing unit may be disposed on a semiconductor chip.

The memory test system may further include a test control unit which is connected to the memory controller and the at least one socket. The memory module may include a small outline dual in-line memory module or an unbuffered dual in-line memory module, and the test control unit may be configured to output a control signal simultaneously selecting the first and second ranks if the test control unit is in the test mode.

According to an exemplary embodiment of the inventive concept, there is provided a memory module that includes a plurality of ranks, each rank including a plurality of semiconductor memory devices; and a test control unit configured to test the ranks as a single rank.

The test control unit may be configured to simultaneously test the ranks.

The test control unit may be configured to provide enabled chip selection signals to each of the ranks.

The test control unit may be configured to be placed in a test mode the test the ranks.

The semiconductor memory devices may include volatile memory devices.

BRIEF DESCRIPTION OF THE DRAWINGS

The above and other features of the inventive concept will become more apparent by describing in detail exemplary embodiments thereof with reference to the accompanying drawings in which.

DETAILED DESCRIPTION OF THE EMBODIMENTS

Hereinafter, exemplary embodiments of the inventive concept will be described in detail with reference to the accompanying drawings.

Figure 1:
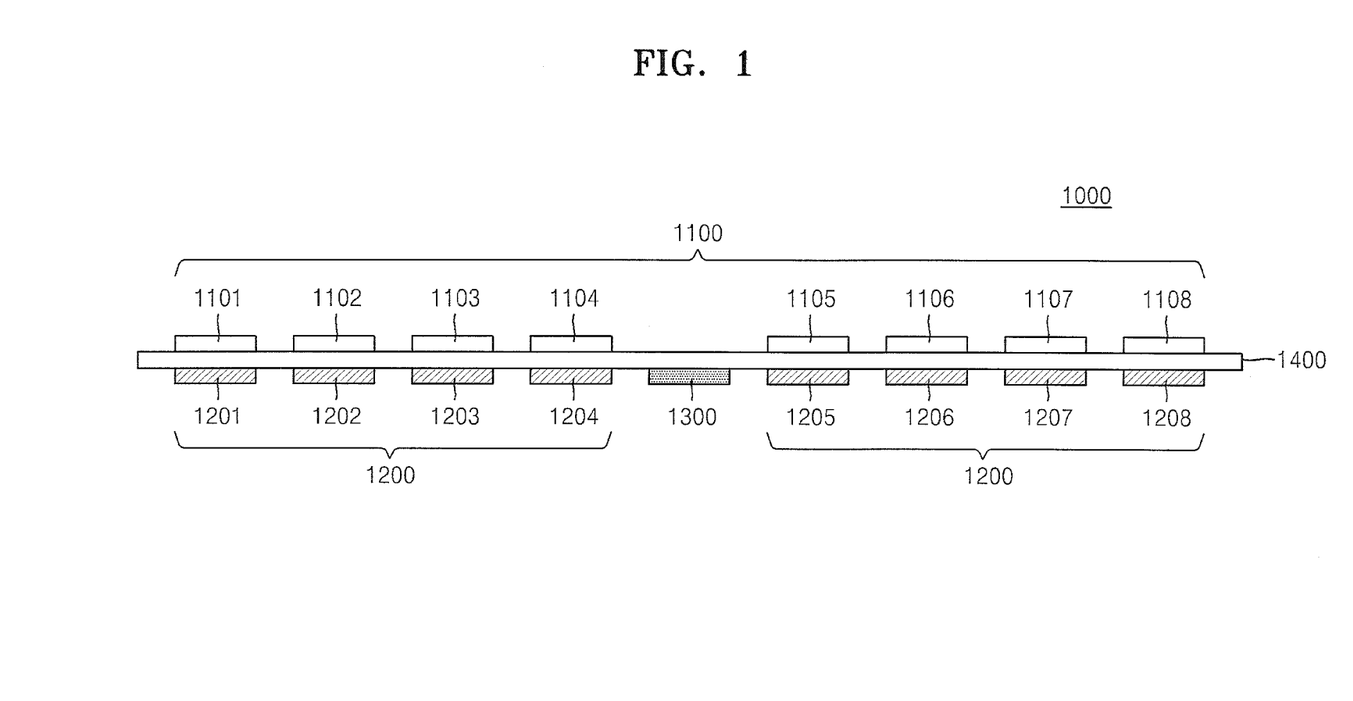
FIG. 1 is a schematic view illustrating a memory module according to an exemplary embodiment of the inventive concept.

FIG. 1 is a schematic view illustrating a memory module 1000 according to an exemplary embodiment of the inventive concept. Referring to FIG. 1, the memory module 1000 includes a first rank 1100, a second rank 1200, a test control unit 1300, and a board 1400. The memory module 1000 includes two ranks, e.g., the first and second ranks 1100 and 1200, in FIG. 1. However, the inventive concept is not limited to a memory module with two ranks and may be applied to a memory module including three or more ranks, for example.

In general, a semiconductor memory device may receive a command signal, an address signal, and a data signal. A rank may include a plurality of semiconductor memory devices which may share address signals and data signals. The data signal of the semiconductor memory devices may be simultaneously output in parallel. For example, as shown in FIG. 1, the first rank 1100 includes eight semiconductor memory devices 1101 through 1108, and the second rank 1200 includes eight semiconductor memory devices 1201 through 1208. The semiconductor memory devices 1101 through 1108 of the first rank 1100 may share an address signal and a command signal. The data signal of the semiconductor memory devices 1101 through 1108 may be output to the outside of the memory module 1000 or may be input to the memory module 1000 from an external source in parallel. According to an exemplary embodiment of the inventive concept, the semiconductor memory devices 1101 through 1108 and 1201 through 1208 of the first and second ranks 1100 and 1200 may be dynamic random access memories (DRAMs). However, the semiconductor memory devices 1101 through 1108 and 1201 through 1208 of the first and second ranks 1100 and 1200 may be other memory types such as static random access memory (SRAM), for example. One rank includes eight semiconductor memory devices in FIG. 1, but the number of semiconductor memory devices which may be included in a rank may be greater or smaller than eight.

The test control unit 1300 is electrically connected to the semiconductor memory devices 1101 through 1108 and 1201 through 1208 of the first and second ranks 1100 and 1200. The test control unit 1300 receives a control signal from the outside of the memory module 1000 and transmits an appropriate signal to the first or second rank 1100 or 1200 according to the control signal. A width of a data signal simultaneously output from the memory module 1000 may be equal to a width of data input into and output from one of the ranks 1100 or 1200.

According to an exemplary embodiment of the inventive concept, the test control unit 1300 may simultaneously test the first and second ranks 1100 and 1200. A state in which the first and/or second ranks 1100/1200 is tested by way of the test control unit 1300 may be referred to as a rank parallel test mode. A state that is not the rank parallel test mode may be referred to as a general mode and the memory module 1000 may write different types of data to the first and/or second ranks 1100/1200 in the general mode. For example, in the rank parallel test mode, the test control unit 1300 may transmit the same signal to the first and second ranks 1100 and 1200 according to the control signal received from the outside of the memory module 1000. In other words, the test control unit 1300 may transmit the same command signal to the first and second ranks 1100 and 1200 to simultaneously write the same type of data to and read the same type of data from the first and second ranks 1100 and 1200.

According to an exemplary embodiment of the inventive concept, the test control unit 1300 may include a memory buffer (MB) or a register clock driver (RCD), and the memory module 1000 may be a registered dual in-line memory module (RDIMM). The MB or the RCD may be positioned between semiconductor memory devices of a memory module and a memory controller and reduce a load on the memory module to allow the memory controller to control more memory modules.

The semiconductor memory devices 1101 through 1108 of the first rank 1100, the semiconductor memory devices 1201 through 1208 of the second rank 1200, and the test control unit 1300 are adhered to the board 1400. The board 1400 may include electric wires and may electrically connect elements of the memory module 1000 adhered to the board 1400 to each other. Although not shown in FIG. 1, the board 1400 may include terminals which pass a signal that the memory module 1000 transmits to and receives from an external device (e.g., a memory system).

Figure 2:
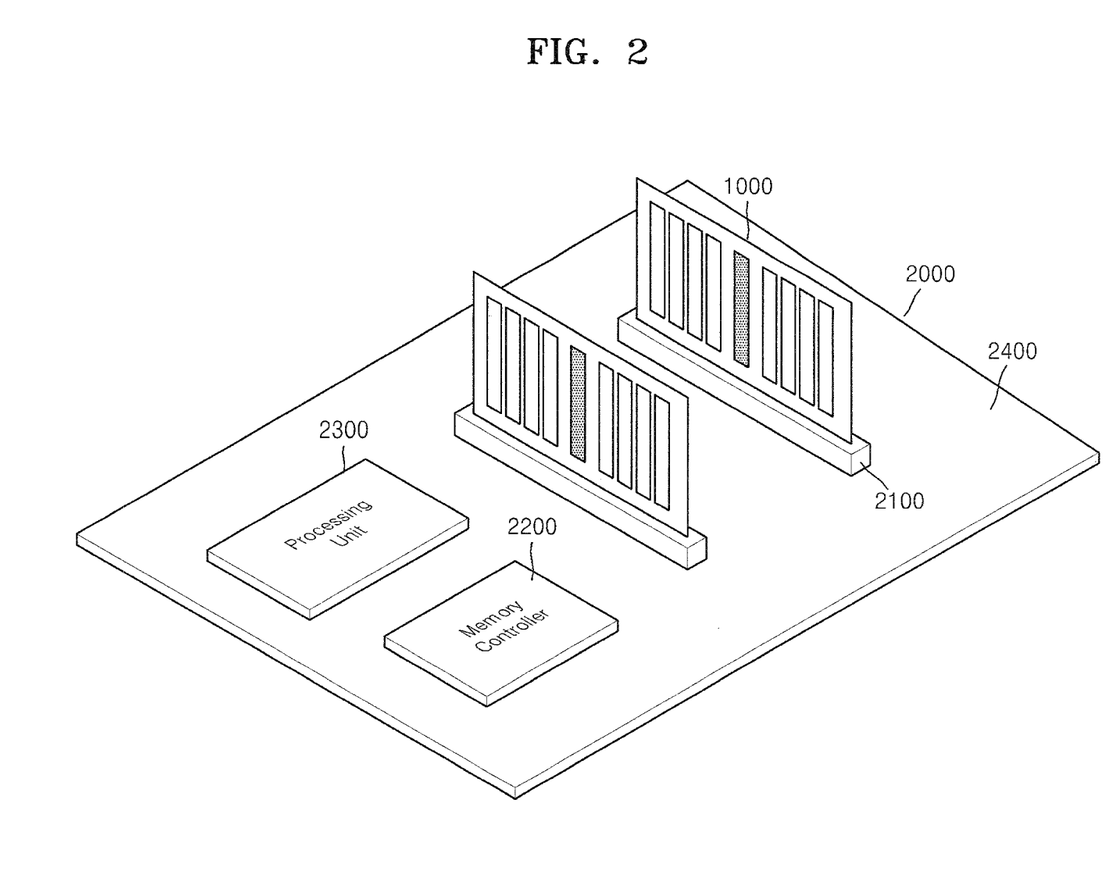
FIG. 2 is a schematic view illustrating a memory test system including a memory module according to an exemplary embodiment of the inventive concept.

FIG. 2 is a schematic view illustrating a memory test system 2000 including memory modules 1000 according to an exemplary embodiment of the inventive concept. Referring to FIG. 2, the memory test system 2000 includes sockets 2100, a memory controller 2200, a processing unit 2300, and a board 2400. The sockets 2100, the memory controller 2200, and the processing unit 2300 are adhered to the board 2400 and are electrically connected to each other through electric wires of the board 2400. The memory modules 1000 are installed on the memory test system 2000 in FIG. 2 but may be separate from the memory test system 2000. According to an exemplary embodiment of the inventive concept, the memory test system 2000 may be a main board or a computing system on which the memory modules 1000 may be installed. In this case, the memory modules 1000 may operate as data memories in the memory test system 2000.

As shown in FIG. 2, the sockets 2100 are adhered to the board 2400. The memory modules 1000 are installed on the memory test system 2000 through the sockets 2100 and are electrically connected to other elements of the memory test system 2000 through the sockets 2100. For example, the memory modules 1000 are electrically connected to the memory controller 2200 through the sockets 2100 and the board 2400. Different from that shown in FIG. 2, the memory test system 2000 may include three or more sockets 2100, and thus, three or more memory modules 1000 may be installed on the memory test system 2000.

The memory controller 2200 outputs a control signal for controlling the memory modules 1000 installed on the memory test system 2000 and, in response to the control signal, receives data from the memory modules 1000. The processing unit 2300 controls the memory controller 2200 to write data to or read data from the memory modules 1000. For example, the processing unit 2300 transmits the data to be written to the memory modules 1000 to the memory controller 2200. In addition, the memory controller 2200 outputs an appropriate control signal to the memory modules 1000 to write the data received from the processing unit 2300 to the memory modules 1000.

In the rank parallel test mode, the memory controller 2200 outputs a control signal for testing the memory modules 1000. For example, the memory controller 2200 may output an appropriate control signal to simultaneously test a plurality of ranks of the memory modules 1000. The operation of the memory controller 2200 for simultaneously testing the plurality of ranks will be described later.

Figure 3:
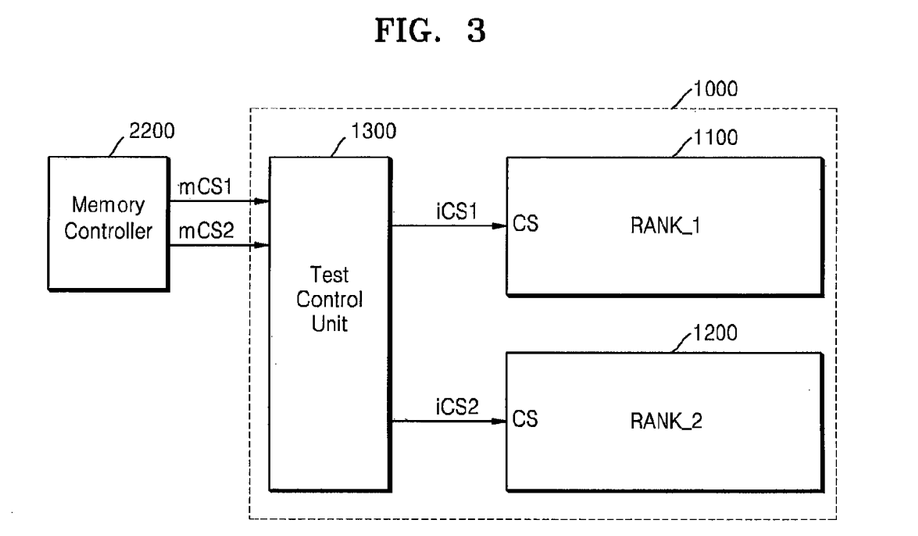
FIG. 3 is a block diagram illustrating a memory module and a memory controller according to an exemplary embodiment of the inventive concept.

FIG. 3 is a block diagram illustrating a memory module 1000 and a memory controller 2200 according to an exemplary embodiment of the inventive concept. Referring to FIG. 3, the memory module 1000 includes a first rank 1100, a second rank 1200, and a test control unit 1300. The memory controller 2200 transmits a control signal to the memory module 1000. For example, as shown in FIG. 3, the control signal includes first and second rank selection signals mCS1 and mCS2.

The first and second rank selection signals mCS1 and mCS2 respectively correspond to the first and second ranks 1100 and 1200. According to the first and second rank selection signals mCS1 and mCS2, it may be determined which of the first and second ranks 1100 and 1200 corresponds to the control signal transmitted from the memory controller 2200 to the memory module 1000. For example, if the memory controller 2200 enables the first rank selection signal mCS1, control signals transmitted from the memory controller 2200 to the memory module 1000 may correspond to the first rank 1100. If the memory controller 2200 enables the second rank selection signal mCS2, control signals transmitted from the memory controller 2200 to the memory module 1000 may correspond to the second rank 1200.

The test control unit 1300 receives the first and second rank selection signals mCS1 and mCS2 from the memory controller 2200. In the general mode, the test control unit 1300 respectively transmits first and second chip selection signals iCS1 and iCS2 to the first and second ranks 1100 and 1200 in response to the first and second rank selection signals mCS1 and mCS2 received from the memory controller 2200. The first chip selection signal iCS1 is transmitted to semiconductor memory devices of the first rank 1100. In other words, with reference to FIG. 1, the semiconductor memory devices 1101 through 1108 of the first rank 1100 may share the first chip selection signal iCS1. If the first chip selection signal iCS1 is enabled, the first rank 1100 (or the semiconductor memory devices of the first rank 1100) may receive control signals from the test control unit 1300 and respond to the control signals. A relation between the second chip selection signal iCS2 and the second rank 1200 is similar to that described above. For example, with reference to FIG. 1, the semiconductor memory devices 1201 through 1208 of the second rank 1200 may share the second chip selection signal iCS2.

In general, the first and second rank selection signals mCS1 and mCS2 may not be simultaneously enabled. A width of a data signal input to the memory module 1000 from the outside and/or output from the memory module 1000 to the outside is equal to a width of a data signal input to and/or output from one rank. Therefore, if the first and second ranks 1100 and 1200 are simultaneously enabled to respectively output data signals, an error may occur in a data signal output to the outside of the memory module 1000. Therefore, the first and second rank selection signals mCS1 and mCS2 may be enabled at different times, and thus the first and second chip selection signals iCS1 and iCS2 may be enabled at different times.

In the rank parallel test mode, the test control unit 1300 simultaneously enables the first and second chip selection signals iCS1 and iCS2. The simultaneous enablement of the first and second chip selection signals iCS1 and iCS2 in the rank parallel test mode causes the first and second ranks 1100 and 1200 to be simultaneously tested, and thus, a test time of the memory module 1000 can be reduced.

Figure 4A:
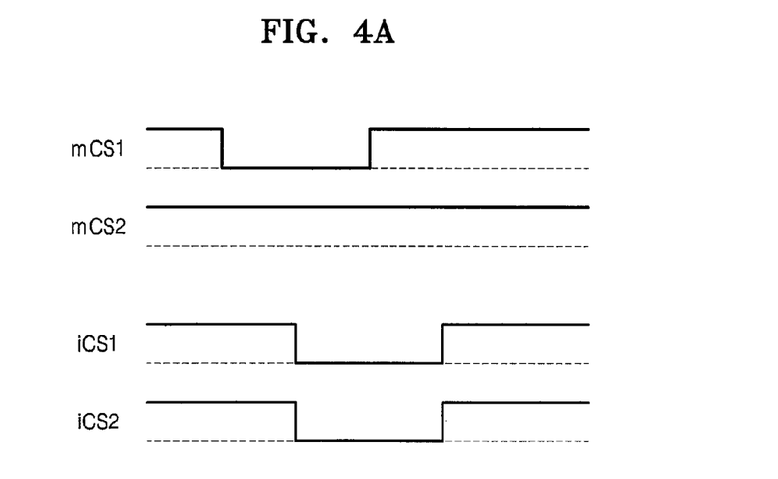
FIGS. 4A and 4B are views illustrating an operation of a test control unit in a rank parallel test mode according to exemplary embodiments of the inventive concept.
Figure 4B:
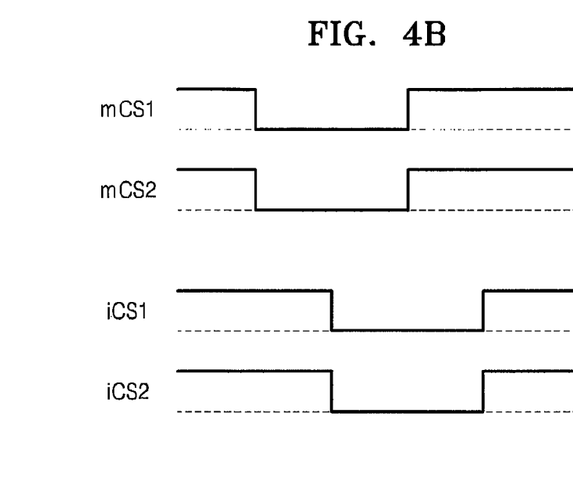

FIGS. 4A and 4B are views illustrating an operation of a test control unit in the rank parallel test mode according to exemplary embodiments of the inventive concept. In the following discussion of FIGS. 4A and 4B, the structural elements of FIGS. 1-3 are referenced. According to an exemplary embodiment of the inventive concept, in the rank parallel test mode, the test control unit 1300 may simultaneously enable first and second chip selection signals iCS1 and iCS2 to simultaneously test the first and second ranks 1100 and 1200.

FIG. 4A is a view illustrating an operation of the test control unit 1300 in the rank parallel test mode according to an exemplary embodiment of the inventive concept. The memory controller 2200 enables a first rank selection signal mCS1 and simultaneously disables a second rank selection signal mCS2. For example, in the rank parallel test mode, the processing unit 2300 controlling the memory controller 2200 may recognize a plurality of ranks of the memory module 1000 as one rank and test the one rank. As shown in FIG. 4A, the processing unit 2300 recognizes that the memory module 1000 includes the first rank 1100 to enable the first rank selection signal mCS1.

If the first rank selection signal mCS1 received from the memory controller 2200 is enabled, the test control unit 1300 simultaneously enables the first and second chip selection signals iCS1 and iCS2 in the rank parallel test mode. Therefore, a control signal received from the memory controller 2200 may be simultaneously input into the first and second ranks 1100 and 1200 as shown by CS in FIG. 3, and thus the first and second ranks 1100 and 1200 may be simultaneously tested.

FIG. 4B is a view illustrating an operation of the test control unit 1300 in the rank parallel test mode according to an exemplary embodiment of the inventive concept. In the general mode, the first and second ranks 1100 and 1200 of the memory module 1000 are accessed through different addresses. Therefore, if the processing unit 2300 writes data to the memory module 1000 or reads data from the memory module 1000 through the memory controller 2200, the first and second rank selection signals mCS1 and mCS2 are enabled at different times. As a result, the processing unit 2300 or the memory controller 2200 may simultaneously enable the first and second rank selection signals mCS1 and mCS2 to request a particular operation of the memory module 1000. In this case, if the first and second rank selection signals mCS1 and mCS2 are simultaneously enabled, the first and second rank selection signals mCS1 and mCS2 do not correspond to the first and second ranks 1100 and 1200 but perform another function. For example, the memory module 1000 may have an adjustable latency in an operation for writing and reading data, and the processing unit 2300 or the memory controller 2200 may simultaneously enable the first and second rank selection signals mCS1 and mCS2 to adjust the latency.

In the rank parallel test mode, if the first and second rank selection signals mCS1 and mCS1 are simultaneously enabled, the test control unit 1300 simultaneously enables the first and second chip selection signals iCS1 and iCS2 according to the first and second rank selection signals mCS1 and mCS2 as shown in FIG. 4B instead of performing the above particular operation. Therefore, a control signal received from the memory controller 2200 is simultaneously input into the first and second ranks 1100 and 1200, and thus, the first and second ranks 1100 and 1200 are simultaneously tested.

Figure 5A:
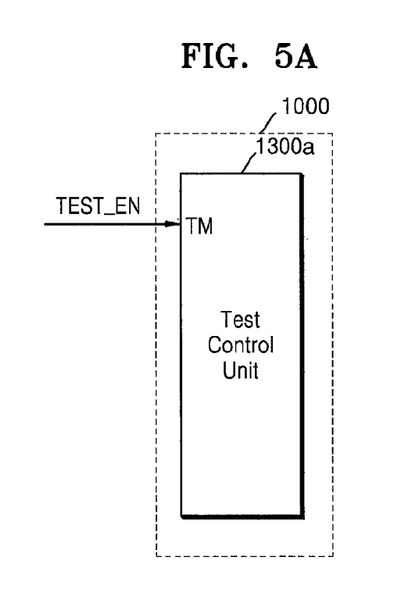
FIGS. 5A and 5B are block diagrams illustrating test control units according to exemplary embodiments of the inventive concept.
Figure 5B:
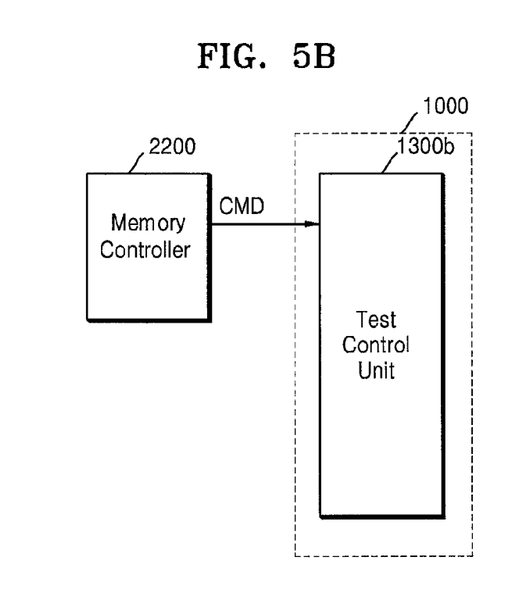

FIGS. 5A and 5B are block diagrams illustrating test control units 1300a and 1300b according to exemplary embodiments of the inventive concept. According to an exemplary embodiment of the inventive concept, the test control unit 1300 of FIG. 1 may be set to the rank parallel test mode. According to exemplary embodiments of the inventive concept, the test control unit 1300 of FIG. 1 may be set to the rank parallel test mode by a signal received from an external source.

FIG. 5A is a block diagram illustrating an interface circuit of the test control unit 1300a including a test mode terminal according to an exemplary embodiment of the inventive concept. As shown in FIG. 5A, the test control unit 1300a includes a test mode terminal TM. The test control unit 1300a is set to the rank parallel test mode according to a signal TEST_EN received through the test mode terminal TM. For example, if the signal TEST_EN received through the test mode terminal TM is at a logic high level, the test control unit 1300a may be set to the rank parallel test mode. If the signal TEST_EN received through the test mode terminal TM is at a logic low level, the test control unit 1300a may operate in the general mode.

FIG. 5B is a block diagram illustrating an interface circuit of the test control unit 1300b according to an exemplary embodiment of the inventive concept. As shown in FIG. 5B, the test control unit 1300b receives a control signal from the memory controller 2200 disposed outside the memory module 1000. The control signal may include a command signal CMD. The memory controller 2200 transmits the command signal CMD to the memory module 1000 to command an operation of writing or reading data or the like. The memory controller 2200 transmits the command signal CMD which commands the test control unit 1300b to be set to the rank parallel test mode. Therefore, the test control unit 1300b is set to the rank parallel test mode or released from the rank parallel test mode by the command signal CMD. For example, the control signal CMD may be input to the memory module 1000 through a plurality of signal lines. In addition, logic levels of signals passing through the plurality of signal lines may be combined to set the memory module 1000 to the rank parallel test mode or release the memory module 1000 from the rank parallel test mode to put the memory module 1000 in the general mode.

Figure 6:
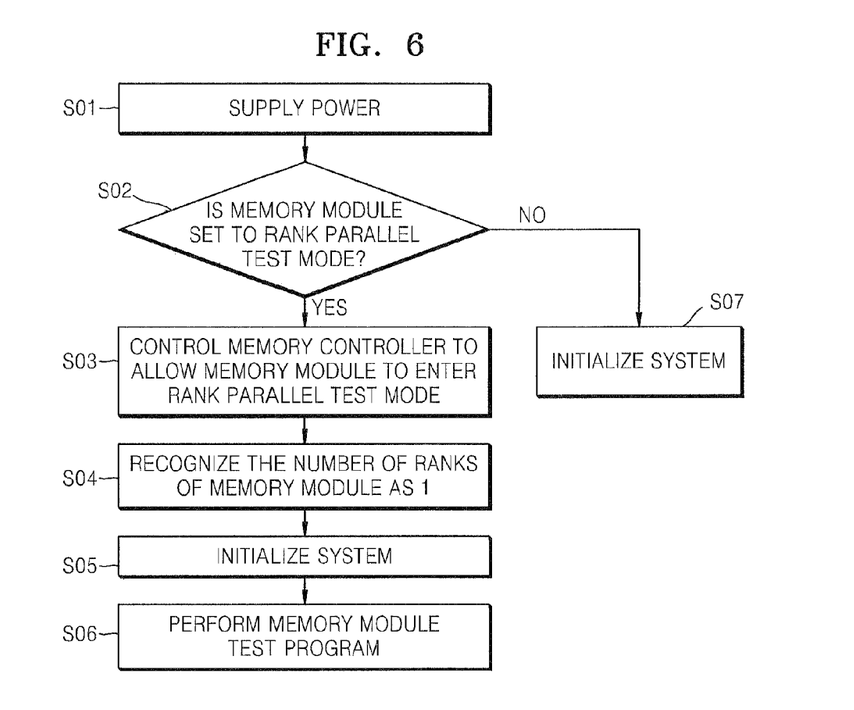
FIG. 6 is a flowchart illustrating a method of testing a memory module according to an exemplary embodiment of the inventive concept.

FIG. 6 is a flowchart illustrating a method of testing a memory module according to an exemplary embodiment of the inventive concept. Referring to FIG. 6, the memory module is installed on a memory test system to be tested at a system level, and the memory test system including the memory module is supplied with power in S01. If power is supplied to the memory module, a processing unit of the memory test system determines whether to enter a rank parallel test mode in S02. For example, the processing unit may determine whether to set the memory module to the rank parallel test mode according to a selection of an external manager. Setting of the rank parallel test mode according to exemplary embodiments of the inventive concept will be described later.

If the processing unit determines that the memory module is set to the rank parallel test mode in S02, the processing unit controls a memory controller to set the memory module to the rank parallel test mode in S03. For example, the processing unit may control the memory controller to output a command CMD which commands the memory module to enter the rank parallel test mode. According to an exemplary embodiment of the inventive concept, the processing unit may perform a basic input/output system (BIOS) of a computing system, and S02 through S04 may be included in the BIOS.

In S04, the processing unit recognizes the number of ranks of the memory module as one. For example, the processing unit may recognize that the memory module includes one rank to write data to or read data from. Therefore, a data storage capacity of the memory module as recognized by the processing unit may be smaller than the actual data storage capacity of the memory module.

In S05, the processing unit, having recognized that memory module includes one rank, initializes a system. For example, the processing unit may perform an operation of initializing the system including the memory test system through an operation of recognizing and setting other elements of the memory test system. In S06, the processing unit performs a memory module test program. Since the processing unit treats the memory module as including one rank, the processing unit may perform a test program of one rank. In addition, the memory module is set to the rank parallel test mode. Therefore, although the processing unit performs a test program of one rank, a plurality of ranks actually in the memory module may be simultaneously tested.

If the processing unit determines that the memory module is not set to the rank parallel test mode in S02, the processing unit initializes the system in S07. In other words, the memory module may operate in the general mode. Therefore, the processing unit may recognize the actual number of ranks of the memory module and thus may control the memory module through the memory controller to write or read data.

Figure 7A:
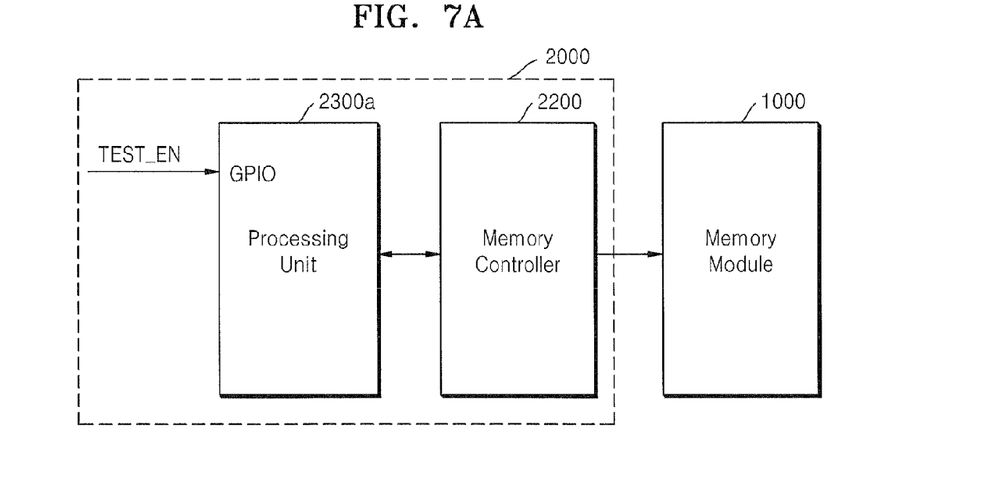
FIGS. 7A and 7B are block diagrams illustrating processing units according to exemplary embodiments of the inventive concept.
Figure 7B:
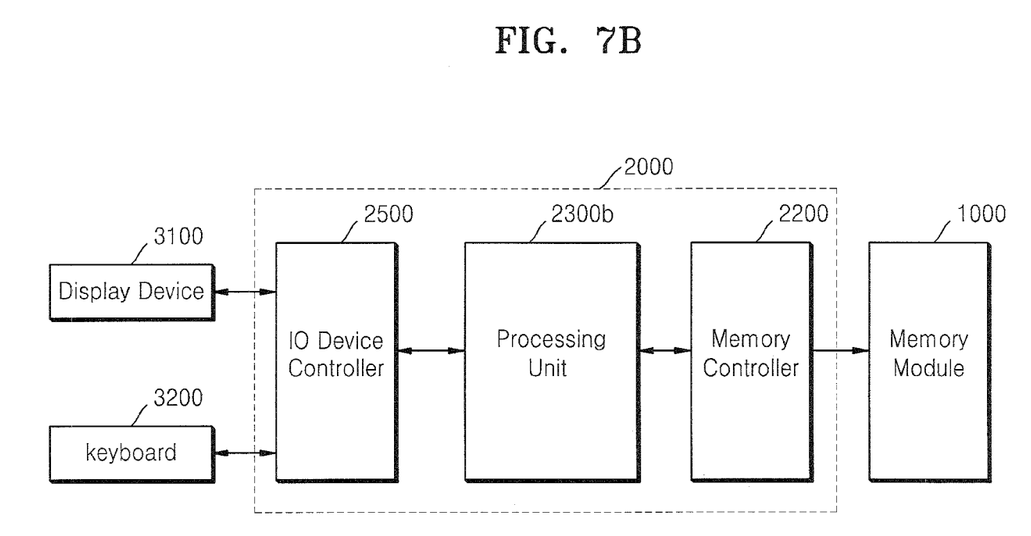

FIGS. 7A and 7B are block diagrams illustrating processing units according to exemplary embodiments of the inventive concept. As described above, a processing unit may determine whether to set a memory module to the rank parallel test mode. In other words, the processing unit may determine whether to test the memory module in the rank parallel test mode according to a setup determined by an external manager. As shown in FIGS. 7A and 7B, a memory test system 2000 includes a processing unit 2300a/2300b and a memory controller 2200, and the memory controller 2200 controlled by the processing unit 2300a/2300b controls a memory module 1000.

FIG. 7A is a block diagram illustrating the processing unit 2300a including a general-purpose port according to an exemplary embodiment of the inventive concept. Referring to FIG. 7A, the processing unit 2300a includes a general-purpose IO (GPIO) and determines whether to set the memory module 1000 to the rank parallel test mode according to a signal TEST_EN received through the GPIO. For example, if the signal TEST_EN received through the GPIO is at a logic high level, the processing unit 2300a sets the memory module 1000 to the rank parallel test mode.

FIG. 7B is a block diagram illustrating the processing unit 2300b according to an exemplary embodiment of the inventive concept. Referring to FIG. 7B, the memory test system 2000 includes an IO device controller 2500. The IO device controller 2500 controlled by the processing unit 2300b controls various types of IO devices which may be connected to the memory test system 2000. For example, as shown in FIG. 7B, the IO device controller 2500 controls a display device 3100 as an output device and a keyboard 3200 as an input device. The IO device controller 2500 transmits data according to a signal input from input devices to the processing unit 2300b and controls output devices to output a signal according to data received from the processing unit 2300b.

The processing unit 2300b controls the IO device controller 2500 to ask an external manager about whether to set the memory module 1000 to the rank parallel test mode and to receive a response from the external manager. For example, the processing unit 2300b controls the IO device controller 2500 to cause the display device 3100 to ask the external manager (e.g., a user) whether they want to set the memory module 1000 to the rank parallel test mode, so that the external manager can set the memory module 1000 to the rank parallel test mode if they choose. The processing unit 2300b also controls the IO device controller 2500 to receive a signal according to an item selected by the external manger through the keyboard 3200 and determines whether to set the memory module 1000 to the rank parallel test mode according to the received signal.

Figure 8:
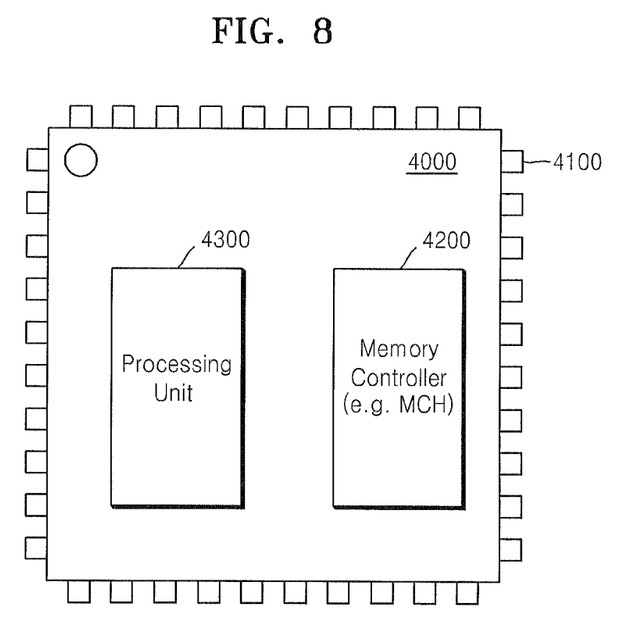
FIG. 8 is a view illustrating a processing unit and a memory controller according to an exemplary embodiment of the inventive concept.

FIG. 8 is a view illustrating a processing unit 4300 and a memory controller 4200 according to an exemplary embodiment of the inventive concept. As shown in FIG. 8, the memory controller 4200 and the processing unit 4300 are included in one semiconductor chip 4000. The semiconductor chip 4000 includes a plurality of terminals 4100, and a control signal which the memory controller 4200 outputs to control a memory module is output through at least one of the terminals 4100. According to an exemplary embodiment of the inventive concept, the semiconductor chip 4000 may a central processing unit (CPU), the processing unit 4300 may be a core of the CPU, and the memory controller 4200 may be a memory controller hub (MCH).

Figure 9:
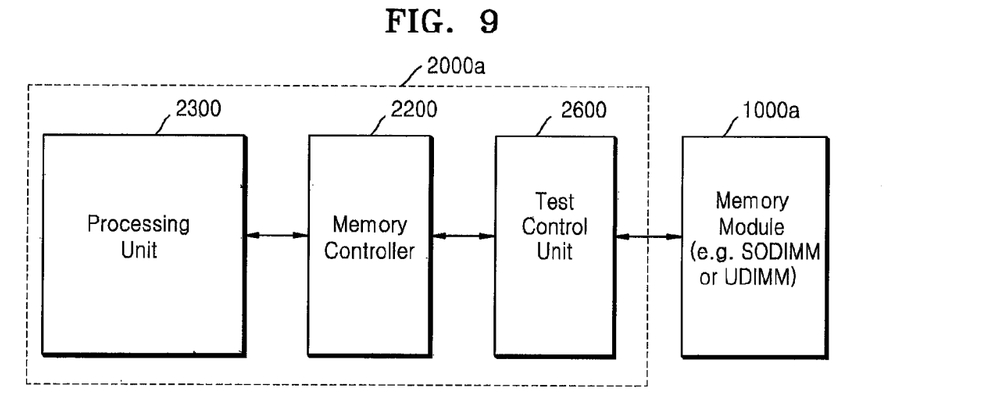
FIG. 9 is a block diagram illustrating a memory test system and a memory module according to an exemplary embodiment of the inventive concept.

FIG. 9 is a block diagram illustrating a memory test system 2000a and a memory module 1000a according to an exemplary embodiment of the inventive concept. Like a small outline dual in-line memory module (SODIMM) or an unbuffered dual in-line memory module (UDIMM), the memory module 1000a may not include a buffer. The memory test system 2000a includes a test control unit 2600 corresponding to the test control unit 1300 as described with reference to FIG. 1, for example. The memory test system 2000a further includes a memory controller 2200 and a processing unit 2300. Details of the memory controller 2200, the processing unit 2300, and the test control unit 2600 are similar to those described above.

Figure 10:
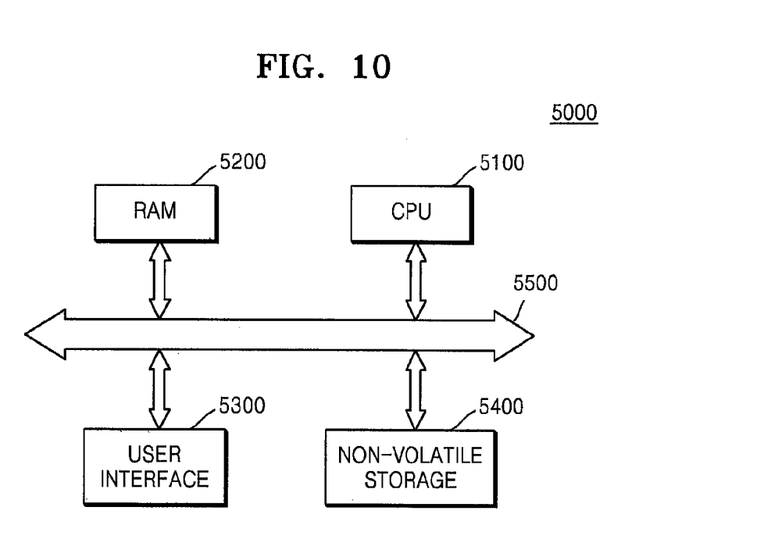
FIG. 10 is a block diagram illustrating a computing system including a memory test system including a memory module according to an exemplary embodiment of the inventive concept.

FIG. 10 is a block diagram illustrating a computing system 5000 including a memory test system including a memory module according to an exemplary embodiment of the inventive concept. The memory module of the inventive concept may be installed as a random access memory (RAM) 5200 in the computing system 5000 such as a mobile device or a desktop computer, and a memory controller and a processing unit of the memory test system may be included in a CPU 5100. The RAM 5200 and the CPU 5100 may be applied to at least one of the exemplary embodiments of the inventive concept described above.

The computing system 5000 according to the present exemplary embodiment includes the CPU 5100, the RAM 5200, a user interface 5300, and a non-volatile storage 5400 which are electrically connected to a bus 5500. In the computing system 5000, the CPU 5100 may include the memory controller which controls the RAM 5200 and the processing unit which controls the memory controller to write data to the RAM 5200 or read data from the RAM 5200.

As in the above-described exemplary embodiments of the inventive concept, the RAM 5200 may include at least one memory module, and the memory module may operate in the general mode or the rank parallel test mode. If the memory module is set to operate in the rank parallel test mode, chip selection signals corresponding to a plurality of ranks of the memory module may be simultaneously enabled.

While the inventive concept has been particularly shown and described with reference to exemplary embodiments thereof, it will be understood by those of ordinary skill in the art that various changes in form and details may be made therein without departing from the spirit and scope of the inventive concept as defined by the following claims.

What is claimed is:

1. A memory module, comprising:
a first rank which comprises a plurality of semiconductor memory devices configured to operate in response to a first chip selection signal;
a second rank which comprises a plurality of semiconductor memory devices configured to operate in response to a second chip selection signal; and
a test control unit configured to receive first and second rank selection signals respectively corresponding to the first and second ranks from an external source,
wherein the test control unit is configured to simultaneously enable the first and second chip selection signals to test the first and second ranks in a test mode in response to the first rank selection signal which is enabled.

2. The memory module of claim 1, wherein the test control unit includes a memory buffer or a register clock driver, and the memory module is a registered dual in-line memory module.

3. The memory module of claim 1, wherein the test control unit is configured to receive a command signal through a plurality of lines from the external source and is put in the test mode or released from the test mode in response to the command signal.

4. The memory module of claim 1, wherein the test control unit comprises a test mode terminal and is put in the test mode in response to a signal received through the test mode terminal.

5. The memory module of claim 1, wherein if the test control unit is in the test mode, the test control unit is configured to output the first and second chip selection signals which have the same logic level as the first rank selection signal.

6. The memory module of claim 1, wherein if the test control unit is in the test mode, the test control unit is configured to simultaneously enable the first and second chip selection signals when the first and second rank selection signals are simultaneously enabled.

7. The memory module of claim 1, wherein the semiconductor memory devices include dynamic random access memories.

8. A memory test system, comprising:
at least one socket configured to be connected with a memory module comprising first and second ranks;
a memory controller configured to output first and second rank selection signals respectively corresponding to the first and second ranks and control the memory module; and
a processing unit configured to determine whether to place the memory module in a test mode and, if the memory module is placed in the test mode, the processing unit is configured to recognize the first and second ranks as a single rank and simultaneously tea the first and second ranks by outputting the first rank selection signal which is enabled.

9. The memory test system of claim 8, wherein the processing unit is configured to perform a basic input/output system (BIOS) and determine whether to place the memory module in the test mode by performing the BIOS.

10. The memory test system of claim 8, wherein the processing unit comprises a general-purpose terminal and is configured to determine whether to place the memory module in the test mode in response to a signal received through the general-purpose terminal.

11. The memory test system of claim 8, further comprising:
an input/output (IO) device controller configured to control an input device through which a user inputs a command,
wherein the processing unit is configured to determine whether to place the memory module in the test mode in response to a signal received through the IO device controller.

12. The memory test system of claim 8, wherein if the memory module is in the test mode, the memory controller is configured to output the first and second rank selection signals at the same time.

13. The memory test system of claim 8, wherein the memory controller and the processing unit are disposed on a semiconductor chip.

14. The memory test system of claim 8, further comprising a test control unit which is connected to the memory controller and the at least one socket,
wherein the memory module includes a small outline dual in-line memory module or an unbuffered dual in-line memory module, and the test control unit is configured to output a control signal simultaneously selecting the first and second ranks if the test control unit is in the test mode.

15. A memory module, comprising:
a plurality of ranks, each rank including a plurality of semiconductor memory devices; and
a test control unit configured to receive a plurality of rank selection signals respectively corresponding to the plurality of ranks from an external source,
wherein the test control unit is configured to test the ranks as a single rank in a test mode in response to one of the plurality of rank selection signals.

16. The memory module of claim 15, wherein the test control unit is configured to simultaneously test the ranks.

17. The memory module of claim 16, wherein the test control unit is configured to provide enabled chip selection signals to each of the ranks.

18. The memory module of claim 15, wherein the test control unit is configured to be placed in a test mode to test the ranks.

19. The memory module of claim 15, wherein the semiconductor memory devices include volatile memory devices.

* * * * *